United States Patent
Burgermeister et al.

(10) Patent No.: US 11,091,050 B2
(45) Date of Patent: Aug. 17, 2021

(54) CHARGING STATION FOR CHARGING AN ELECTRIC VEHICLE

(71) Applicant: Bucher Hydraulics AG, Nuheim (CH)

(72) Inventors: Andreas Burgermeister, Mauren (CH); Dirk Schekulin, Gais (CH); Erich Sidler, Pfyn TG (CH)

(73) Assignee: Bucher Hydraulics AG, Neuheim (CH)

( * ) Notice: Subject to any disclaimer, the term of this patent is extended or adjusted under 35 U.S.C. 154(b) by 105 days.

(21) Appl. No.: 16/528,932

(22) Filed: Aug. 1, 2019

(65) Prior Publication Data
US 2020/0039369 A1    Feb. 6, 2020

(30) Foreign Application Priority Data
Aug. 2, 2018  (DE) .................. 10 2018 212 978.9

(51) Int. Cl.
*B60L 53/302*  (2019.01)
*B60L 53/18*   (2019.01)
(Continued)

(52) U.S. Cl.
CPC .......... *B60L 53/302* (2019.02); *B60L 53/18* (2019.02); *H02J 7/0042* (2013.01); *H05K 7/20* (2013.01)

(58) Field of Classification Search
CPC ......... B60L 53/302; B60L 53/18; H05K 7/20; H02J 7/0042
(Continued)

(56) References Cited

U.S. PATENT DOCUMENTS 5,583,418 A * 12/1996 Honda et al. ........... B60L 53/14
                                                    320/109
6,366,050 B2 * 4/2002 Kajiura ................... B60L 53/31
                                                    320/108
(Continued)

FOREIGN PATENT DOCUMENTS

DE   10 2016 122 008 A1   5/2018
DE   10 2017 217 879 A1   4/2019
WO   WO 2012/041902 A2    4/2012

OTHER PUBLICATIONS

APEC, "APEC Low-Carbon Model Town Energy Management System Development and Application Research", 2013, Shandong Sacred Sun Power Source Co. Ltd., 1 set (106 pages).*

*Primary Examiner* — Sun J Lin
(74) *Attorney, Agent, or Firm* — Crowell & Moring LLP

(57) ABSTRACT

A charging station charges an electric vehicle. The charging station has: a housing, a number of first power electronics components and a number of second power electronics components, the second electronics components being different from the first power electronics components, wherein the first power electronics components and the second power electronics components are arranged spatially in the housing, and a first air cooling circuit and a second air cooling circuit separate from the first air cooling circuit. The air cooling circuits are arranged spatially in the housing. The first air cooling circuit serves to cool the number of first power electronics components. The second air cooling circuit serves to cool the number of second power electronics components. The charging station is designed such that a first protection class of at least one region of the first air cooling circuit is higher than a second protection class of the second air cooling circuit.

19 Claims, 6 Drawing Sheets

(51) Int. Cl.
*H02J 7/00* (2006.01)
*H05K 7/20* (2006.01)

(58) Field of Classification Search
USPC .......................................................... 320/109
See application file for complete search history.

(56) References Cited

U.S. PATENT DOCUMENTS

| | | | | |
|---|---|---|---|---|
| 8,037,954 | B2* | 10/2011 | Taguchi | B60H 1/00257 |
| | | | | 180/65.1 |
| 8,283,819 | B2* | 10/2012 | Tanaka | H02K 19/365 |
| | | | | 310/68 D |
| 9,446,676 | B2* | 9/2016 | Reinschke | B60L 11/1824 |
| 9,555,715 | B2* | 1/2017 | Sugano | B60L 53/31 |
| 10,283,990 | B2 | 5/2019 | Fuchs et al. | |
| 10,384,511 | B2* | 8/2019 | Porras et al. | B60H 1/323 |
| 2019/0061539 | A1* | 2/2019 | Spilger et al. | H02J 13/0005 |
| 2019/0106004 | A1 | 4/2019 | Heyne et al. | |
| 2019/0267822 | A1* | 8/2019 | Waffner et al. | H05K 7/209 |

* cited by examiner

CHARGING STATION FOR CHARGING AN ELECTRIC VEHICLE

BACKGROUND AND SUMMARY OF THE INVENTION

The invention relates to a charging station for charging an electric vehicle.

A charging station for charging an electric vehicle is known.

The problem on which the invention is based is that of providing a charging station for charging an electric vehicle that allows protection and optimum cooling of power electronics components, on the one hand, and inexpensive manufacture, on the other hand.

The invention solves this problem by providing a charging station for charging an electric vehicle, wherein the charging station has: a housing; a number of first power electronics components and a number of second power electronics components different from the first power electronics components, wherein the power electronics components are arranged spatially in the housing; and a first air cooling circuit and a second air cooling circuit separate from the first air cooling circuit, wherein the air cooling circuits are arranged spatially in the housing. The first air cooling circuit serves to cool the number of first power electronics components. The second air cooling circuit serves to cool the number of second power electronics components. The charging station is designed such that a first protection class of at least one region of the first air cooling circuit is higher than a second protection class of the second air cooling circuit.

The in particular electric charging station, in particular wall charging station, according to the invention is designed or configured so as to in particular automatically charge an electric vehicle, in particular an electric automobile, in particular an electrical energy store of the electric vehicle. The charging station has a housing, in particular a protective housing. The charging station furthermore has a number of first power electronics components and a number of second power electronics components different from the first power electronics components. The power electronics components are arranged spatially in the housing, in particular inside the housing. The charging station furthermore has a first air cooling circuit and a second air cooling circuit distinct or separate, in particular different, from the first air cooling circuit. The air cooling circuits are arranged spatially in the housing, in particular inside the housing. The first air cooling circuit furthermore serves to cool the number of first power electronics components or is designed or configured so as to cool the number of first power electronics components. In addition, the second air cooling circuit serves to cool the number of second power electronics components or is designed or configured so as to cool the number of second power electronics components. The charging station, in particular its housing, is furthermore designed or configured or formed such that a first protection class of at least one region of the first air cooling circuit, in particular of the complete first air cooling circuit, is higher than a second protection class of the second air cooling circuit, in particular in an in particular intended installation position or installation alignment of the charging station, in particular in the case of attachment to a wall.

The charging station or its housing or the higher protection class at least of the region of the first air cooling circuit allows optimum protection of the power electronics components, in particular of the number of first power electronics components. The charging station or its air cooling circuits furthermore allow optimum cooling of the power electronics components, and therefore make it possible to avoid overheating and destruction of the power electronics components. The air cooling circuits, in particular the different protection classes of the air cooling circuits, furthermore allow inexpensive manufacture of the charging station, in particular in comparison with previous cost-intensive charging stations having an expensive cooling system, such as a water cooling circuit and/or a heat pipe, in particular for the number of first power electronics components.

The charging station, in particular its housing, may in particular be designed or configured for attachment to the wall. The charging station may be referred to as a wall charging station or wallbox charger. In addition or as an alternative, the charging station may be intended or designed or conceived for use in indoor spaces or protected outdoor areas. Again in addition or as an alternative, the charging station may be designed or configured so as to charge the electric vehicle, in particular with electrical energy from an electricity grid, and so as to discharge the electric vehicle, in particular so as to feed electrical energy into the electricity grid. The charging station may be referred to as a bidirectional charging station. Again in addition or as an alternative, the electric vehicle, in particular its electrical energy store, where present, may be referred to as a grid buffer. Again in addition or as an alternative, the electric vehicle may be referred to as an electric-drive motor vehicle for passenger and freight transport.

The number of first power electronics components may be one, two, three, four, five, six, seven, eight, nine, at least ten, at least fifteen, or at least twenty. In addition or as an alternative, the number of second power electronics components may be one, two, three, four, five, six, seven, eight, nine, at least ten, at least fifteen, or at least twenty. Again in addition or as an alternative, the power electronics components may be designed or configured so as to or serve to charge, in particular to recharge and to discharge, the electric vehicle. The charging station may in particular additionally have at least one in particular electrical and/or electronic component, in particular a control device, such as a processor, for charging the electric vehicle, in particular for controlling at least one of the power electronics components.

The power electronics components may heat or warm up, in particular heat themselves or warm themselves up, during charging, in particular during recharging and discharging, of the electric vehicle, in particular due to power losses. The first air cooling circuit, in particular air of the first air cooling circuit, may in particular serve or be designed or configured so as to absorb the heat or the waste heat from the number of first power electronics components. In addition or as an alternative, the second air cooling circuit, in particular air of the second air cooling circuit, may serve or be designed or configured so as to absorb the waste heat from the number of second power electronics components. Air may in particular serve as coolant.

Separate may mean that air of the first air cooling circuit in the housing or inside the housing is not able to flow into the second air cooling circuit and/or air of the second air cooling circuit in the housing or inside the housing is not able to flow into the first air cooling circuit, in particular without leaving the housing.

The in particular respective protection class (or IP code) may define the in particular respective scope of protection of the in particular respective air cooling circuit, in particular of an electrical component, in particular power electronics component, arranged spatially in the at least one region of the air cooling circuit in contact with air of the air cooling circuit, in the housing of the charging station against contact and/or foreign bodies and/or moisture or water and/or the impact resistance, in particular provided by the or by way of the charging station, in particular its housing. In addition or as an alternative, the first protection class at least of the region of the first air cooling circuit may be at least IP54, spray water protection. In other words: at least the region of the first air cooling circuit may itself be designed or configured or formed so as to be protected against spray water or spray water-protected or have dedicated spray water protection, in particular in the installation position of the charging station, in particular in the case of attachment to a wall. Worded differently: an electrical component, in particular a power electronics component, in particular a first power electronics component, arranged spatially in the at least one region of the first air cooling circuit in contact with in particular first air of the first air cooling circuit does not need to or cannot itself be protected against spray water or be designed to be protected against spray water or have dedicated spray water protection. Again in addition or as an alternative, the second air cooling circuit may be designed or configured so as to be water-compatible. In other words: an electrical component, in particular a power electronics component, arranged spatially in the second air cooling circuit in contact with in particular second air of the second air cooling circuit should or may itself be protected against spray water or be designed to be protected against spray water or have dedicated spray water protection. At least one region may mean at least 25 percent (%), in particular at least 50%, in particular at least 75%, of a volume, in particular of an air volume, of the first air cooling circuit.

Again in addition or as an alternative, a protection class of the housing may be IK10, protection against damage through impacts. Again in addition or as an alternative, the housing may consist partly or completely of an insulating material or electrically non-conductive material, in particular a plastic.

In one development of the invention, the number of first power electronics components has at least one inductive component, in particular a transformer and/or an audio transformer or pulse transformer and/or a choke, in particular an EMC choke (EMC: electromagnetic compatibility) and/or a grid choke, in particular a PFC choke (PFC: power factor correction or power factor compensation), or at least one, in particular several, in particular all, of the number of first power electronics components is, in particular are, in particular in each case an inductive component. In addition or as an alternative, the number of second power electronics components has at least one power electronics switch, in particular a power semiconductor, in particular an IGBT (IGBT: insulated-gate bipolar transistor), or at least one, in particular several, in particular all, of the number of second power electronics components is, in particular are, in particular in each case a power electronics switch. The at least one inductive component may in particular heat or warm up upon a change of magnetization. In addition or as an alternative, the at least one power electronics switch may heat or warm up due to switching losses. Again in addition or as an alternative, the charging station may have at least one converter, in particular a frequency converter, and/or a network feedback device, wherein in particular the converter and/or the network feedback device, in particular in each case, may have at least one of the power electronics components, in particular the number of second power electronics components.

In one development of the invention, the first air cooling circuit has at least one first in particular electric fan or blower. The first fan is arranged spatially in particular in the housing, in particular in the first air cooling circuit, in particular in the at least one region, in particular in contact with air of the first air cooling circuit, and is designed or configured so as to convey or generate an in particular first air flow through the first air cooling circuit or in the first air cooling circuit. In addition or as an alternative, the second air cooling circuit has at least one in particular electric second fan or blower, which, where present, is in particular different from the first fan or blower. The second fan is arranged spatially in particular in the housing, in particular in the second air cooling circuit, in particular in contact with air of the second air cooling circuit, and is designed or configured so as to convey or generate an in particular second air flow through the second air cooling circuit or in the second air cooling circuit. The first fan allows forced convection in the first air cooling circuit and thus allows waste heat to be entrained and transported away or guided away through the or by way of the in particular first air flow. In addition or as an alternative, the second fan allows forced convection in the second air cooling circuit and thus allows waste heat to be entrained and transported away or guided away through the or by way of the in particular second air flow. In particular, the first fan and/or the second fan may be different from the power electronics components. In addition or as an alternative, at least the second fan may have the protection class IP54 or dedicated spray water protection or itself be protected against spray water or designed to be protected against spray water.

In one development of the invention, at least one, in particular several, in particular all, of the number of first power electronics components is, in particular are, arranged spatially at least partly, in particular completely, in the first air cooling circuit, in particular in the at least one region, in particular direct contact with in particular first air of the first air cooling circuit. In addition or as an alternative, the charging station has a heat sink, in particular different from the power electronics components. The heat sink is arranged spatially at least partly, in particular completely, in particular in the housing, in the second air cooling circuit, in particular direct contact with in particular second air of the second air cooling circuit. At least one, in particular several, in particular all, of the number of second power electronics components is, in particular are, in particular direct contact, in particular mechanical and/or surface contact, with the heat sink. The contact with in particular first air of the first power electronics component allows direct cooling of the first power electronics component or a direct transfer of heat from the first power electronics component to the in particular first air. The higher protection class at least of the region of the first air cooling circuit in particular allows contact with in particular first air of the first power electronics component. In addition or as an alternative, the contact with in particular second air of the heat sink and the contact with the heat sink of the second power electronics component allow indirect cooling of the second power electronics component or an indirect transfer of heat from the second power electronics component to the in particular second air. In particular, at least one, in particular several, in particular all, of the number of second power electronics components does not need to, in particular do not need to, or may not be arranged spatially in the second air cooling circuit in particular direct contact with in particular second air of the second air cooling circuit. In addition or as an alternative, at least one, in particular several, in particular all of the number of second power electronics components does not need to, in particular do not need to, or may not be protected itself or themselves against spray water, where present, in the second air cooling circuit or be designed to be protected against spray water or have dedicated spray water protection. In particular, the heat sink may protect at least one, in particular several, in particular all, of the number of second power electronics components against spray water, where present, in the second air cooling circuit. Again in addition or as an alternative, the air flow, in particular generated by the first fan, where this air flow is present, may flow along or flow past the at least one of the number of first power electronics components, in particular flow around it. Again in addition or as an alternative, the air flow, in particular generated by the second fan, where this air flow is present, may flow along or flow past the heat sink, in particular flow around it. Again in addition or as an alternative, the heat sink may have cooling fins. At least partly may mean at least 25%, in particular at least 50%, in particular at least 75% of a surface of the at least one of the number of first power electronics components or of the heat sink.

In one development of the invention, the charging station has an in particular electrical circuit board, in particular arranged spatially in the housing. At least one, in particular several, in particular all, of the number of first power electronics components is, in particular are, electrically connected to the circuit board, and in particular mechanically connected thereto or carried thereby, and arranged spatially on a circuit board front side of the circuit board. Furthermore, at least one, in particular several, in particular all, of the number of second power electronics components is, in particular are, electrically connected to the circuit board, and in particular mechanically connected thereto or carried thereby, and arranged spatially on a circuit board rear side, facing away from or opposite the circuit board front side, of the circuit board. This allows a space-saving arrangement of the power electronics components, in particular in the housing, and/or inexpensive manufacture of the charging station. In particular, the circuit board may be referred to as a power electronics circuit board and/or double-sided circuit board. The charging station may in particular have just a single power electronics circuit board. In addition or as an alternative, the circuit board may be different from the power electronics components.

In one configuration of the invention, the charging station has a circuit board cover element that is in particular different from the power electronics components. The circuit board cover element is arranged spatially in particular in the housing, in particular in the first air cooling circuit, in particular in contact with air of the first air cooling circuit, and at least partly covers the circuit board on the front side and has at least one through-aperture. The circuit board cover element may in particular completely cover the circuit board on the front side with the exception of the at least one through-aperture. The at least one of the number of first power electronics components is guided through the through-aperture or extends through the through-aperture. In addition or as an alternative, the heat sink at least partly, in particular completely, covers the circuit board on the rear side. The at least one of the number of second power electronics components is arranged spatially between the circuit board and the heat sink. The circuit board cover element makes it possible to protect the circuit board, in particular the electrical connection to the at least one of the number of first power electronics components, in particular against residual water, where present, in the first air cooling circuit. In addition or as an alternative, the heat sink makes it possible to protect the circuit board, in particular the electrical connection to the at least one of the number of second power electronics components, in particular against spray water, where present, in the second air cooling circuit. In particular, the at least one of the number of first power electronics components may be arranged spatially at least partly in the first air cooling circuit in particular direct contact with air of the first air cooling circuit, as described above. In addition or as an alternative, the heat sink may be arranged spatially at least partly in the second air cooling circuit in particular direct contact with air of the second air cooling circuit, as described above. The at least one of the number of second power electronics components may be in particular direct contact with the heat sink, as described above. At least partly may mean at least 25%, in particular at least 50%, in particular at least 75% of a surface of the circuit board front side or of the circuit board rear side.

In one development of the invention, the housing has a housing front side that is vertical or vertically aligned in particular in the installation position and a housing rear side facing away from or opposite the housing front side and that is vertical or vertically aligned in particular in the installation position. The charging station is designed or configured or formed such that the housing rear side, when the charging station is attached to a wall, faces the wall. The charging station, in particular the housing rear side, may in particular bear against the wall when the charging station is attached. The first air cooling circuit is arranged spatially closer to the housing front side than the second air cooling circuit. Worded differently: the second air cooling circuit may be arranged spatially closer to the housing rear side than the first air cooling circuit. In other words: when attached to the wall, in particular in the installation position of the charging station, the first air cooling circuit may be arranged away from the wall and/or the second air cooling circuit may be arranged close to the wall. The charging station, in particular its housing, may in particular be designed for attachment to the wall, as described above. The charging station may be referred to as a wall charging station, as described above. In addition or as an alternative, the housing rear side may be referred to as wall side.

In one development, in particular one configuration, of the invention, the housing has a housing body and a housing cover that is in particular different from the housing body. The first air cooling circuit is arranged spatially at least partly, in particular completely, between the housing body and the housing cover. This, in particular the housing cover, allows easy entry or access to the first air cooling circuit, and in particular therefore to at least one of the number of first power electronics components and/or at least one of the number of second power electronics components and/or the first fan, where present, and/or the circuit board, where present, and/or the circuit board cover element, where present. Exchanging certain components during servicing may therefore be easier. The housing cover may in particular be designed or configured as a hinged or removable closure of the housing body. In addition or as an alternative, the housing cover may be arranged spatially on the housing front side or define the housing front side. Again in addition or as an alternative, the housing body may be arranged spatially on the housing rear side or define the housing rear side. Again in addition or as an alternative, the housing body may be designed or configured for attachment to the wall. Again in addition or as an alternative, the housing body and/or the housing cover may in particular in each case consist partly or completely of an insulating material or electrically non-conductive material, in particular a plastic.

In one configuration of the invention, the housing body, in particular a housing wall of the housing body, has at least one cable through-aperture, in particular two cable through-apertures, for a charging cable, in particular for an electrical connection to the electric vehicle, and/or a grid cable, in particular for an electrical connection to the electricity grid. The cable through-aperture leads into the first air cooling circuit, in particular from the outside. This, in particular the housing cover, allows easy entry or access to an electrical terminal, in particular for an electrical connection, for the charging cable and/or the grid cable, in particular on the circuit board, where present. The electrical terminal may in particular have or be a circuit board connection terminal and/or a PCB terminal.

In addition or as an alternative, the charging station, in particular the housing, in particular the housing body, where present, may have at least one holder for holding an, in particular the, charging cable, in particular a plug, in particular a vehicle plug, of the cable.

In one development of the invention, the housing has a housing front side that is vertical or vertically aligned in particular in the installation position and a housing rear side facing away from or opposite the housing front side and that is vertical or vertically aligned in particular in the installation position. The charging station is designed or configured or formed such that the housing rear side, when the charging station is attached to a wall, faces the wall. The charging station, in particular the housing rear side, may in particular bear against the wall when the charging station is attached. The housing, in particular the housing body, where present, is open at the housing rear side, in particular at at least one location. The second air cooling circuit is arranged spatially at least partly, in particular completely, on the housing rear side. This allows easy entry or access to the second air cooling circuit, and in particular therefore to at least one of the number of second power electronics components and/or the heat sink, where present, and/or the circuit board, where present. Exchanging certain components during servicing may therefore be easier. In addition or as an alternative, upon attachment to the wall, in particular in the installation position of the charging station, this allows in particular second air of the second air cooling circuit to make contact with the wall. Waste heat is thus able to be absorbed and dissipated by the or by way of the wall. The charging station, in particular its housing, may in particular be designed for attachment to the wall, as described above. The charging station may be referred to as a wall charging station, as described above. In addition or as an alternative, the housing rear side may be referred to as wall side.

In one development of the invention, the first air cooling circuit has at least one first air inlet aperture, in particular intake aperture, in the housing, in particular in a housing wall of the housing and/or in the housing body, where present, in particular for air from the outside into the first air cooling circuit. The first air cooling circuit is designed or configured or formed so as to guide air of an in particular first air inflow from the first air inlet aperture underneath at least one, in particular several, in particular all, of the number of first power electronics components in the installation position of the charging station, in particular in the case of attachment to a wall, in particular before air is guided to the at least one of the number of first power electronics components. Worded differently: the first air cooling circuit may be designed or configured or formed so as to guide air of the in particular first air inflow from the first air inlet aperture underneath the at least one region in the installation position of the charging station, in particular in the case of attachment to the wall, in particular before air is guided to the at least one region. In other words: air, in particular from the air inlet aperture, may have to flow upward to the at least one of the number of first power electronics components or the at least one region in the installation position of the charging station, in particular in the case of attachment to the wall. This, in particular gravity, makes it possible to protect the at least one of the number of first power electronics components against residual water, where present, in the air, in particular in the air inflow. The first air cooling circuit may in particular be referred to as open air cooling circuit.

In one development of the invention, the first air cooling circuit has at least one first air inlet aperture, in particular intake aperture, and/or at least one first air outlet aperture in the housing, in particular in a housing wall of the housing and/or in the housing body, where present, in particular for air from the outside into the first air cooling circuit and/or from the first air cooling circuit to the outside. The first air inlet aperture and/or the first air outlet aperture are/is arranged spatially underneath at least one, in particular several, in particular all, of the number of first power electronics components in the installation position of the charging station, in particular in the case of attachment to a wall, in particular on a housing bottom side, which is horizontal or horizontally aligned in particular in the installation position, and/or a housing circumferential side, which is vertical or vertically aligned in particular in the installation position, of the housing. Worded differently: the first air inlet aperture and/or the first air outlet aperture may be arranged spatially underneath the at least one region in the installation position of the charging station, in particular in the case of attachment to the wall, in particular on the housing bottom side and/or the housing circumferential side of the housing. In other words: air, in particular from the air inlet aperture and/or the air outlet aperture, may have to flow upward to the at least one of the number of first power electronics components or the at least one region in the installation position of the charging station, in particular in the case of attachment to the wall. This, in particular gravity, makes it possible to protect the at least one of the number of first power electronics components against residual water, where present, in the air. The first air cooling circuit may in particular be referred to as open air cooling circuit.

In one development of the invention, the second air cooling circuit has at least one second air inlet aperture, in particular intake aperture, in the housing, in particular in a housing wall of the housing and/or in the housing body, where present, in particular for air from the outside into the second air cooling circuit. The second air inlet aperture is spatially arranged on a housing bottom side, which is horizontal or horizontally aligned in particular in the installation position, of the housing in the installation position of the charging station, in particular in the case of attachment to a wall. In addition or as an alternative, the second air cooling circuit has at least one second air outlet aperture in the housing, in particular in a housing wall of the housing, in particular for air from the second air cooling circuit to the outside. The second air outlet aperture is arranged spatially on a housing circumferential side, which is vertical or vertically aligned in particular in the installation position, of the housing in the installation position of the charging station, in particular in the case of attachment to a wall, in particular above the second air inlet aperture and/or at least one, in particular several, in particular all, of the number of second power electronics components. The second air cooling circuit may in particular be referred to as open air cooling circuit.

In one development of the invention, the charging station has a base body that is in particular different from the power electronics components. The base body carries at least one, in particular several, in particular all, of the number of first power electronics components and/or at least one, in particular several, in particular all, of the number of second power electronics components and/or the first fan, where present, and/or the second fan, where present, and/or the heat sink, where present, and/or the circuit board, where present, and/or the circuit board cover element, where present. The housing, in particular the housing body, where present, is placed on the base body, in particular following a mechanical connection or attachment of the components to be carried. This allows simple and therefore inexpensive manufacture of the charging station. In addition or as an alternative, this allows easy exchanging of certain components during servicing. The base body may in particular be a stamped and bent part made from sheet metal. In addition or as an alternative, the base body may consist partly or completely of an electrical conductor and/or thermal conductor or electrically conductive and/or thermally conductive material, in particular a metal. The base body may in particular be designed or configured so as to ground the components that are carried. Again in addition or as an alternative, the base body may be designed or configured for attachment to a wall.

In one development of the invention, the first air cooling circuit and the second air cooling circuit are separated at least partly, in particular completely, from one another by the housing and/or the heat sink, where present, and/or the housing body, where present, and/or the base body, where present, and/or at least one gasket, in particular between two of these components, in particular between the heat sink and the base body.

Further advantages and aspects of the invention will emerge from the claims and from the following description of preferred exemplary embodiments of the invention, which are explained below with reference to the figures.

DETAILED DESCRIPTION OF THE DRAWINGS

Figure 1:
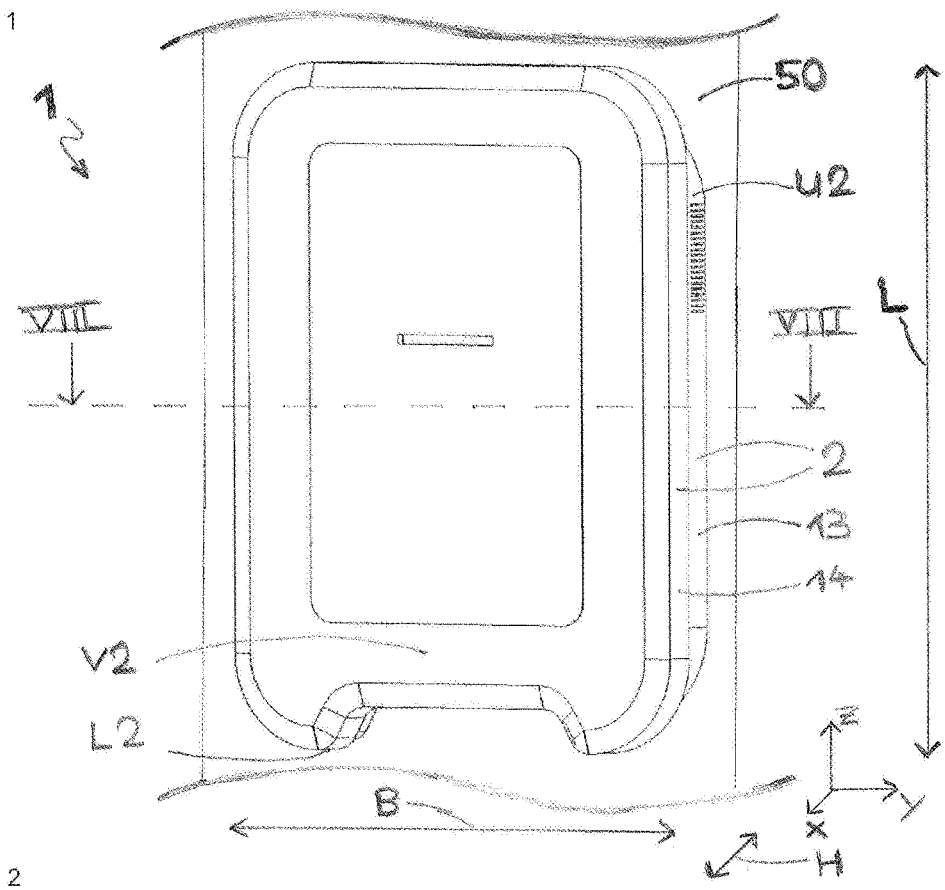
FIG. 1 shows a schematic perspective view of a charging station according to the invention in the installation position in the case of attachment to a wall.

FIGS. 1 to 9 and FIGS. 10 to 14 each show an exemplary embodiment of a charging station 1 according to the invention, in particular a wall charging station. The charging station 1 is designed to charge an electric vehicle. The charging station has an in particular cuboid housing 2. The charging station 1 furthermore has a number of first power electronics components 3 and a number of second power electronics components 4 different from the first power electronics components. The power electronics components 3, 4 are arranged spatially in the housing 2. The charging station 1 furthermore has a first air cooling circuit 5 and a second air cooling circuit 6 separate from the first air cooling circuit. The air cooling circuits 5, 6 are arranged spatially in the housing 2. The first air cooling circuit 5 furthermore serves to cool the number of first power electronics components 3. The second air cooling circuit 6 furthermore serves to cool the number of second power electronics components 4. The charging station 1 is additionally designed such that a first protection class of at least one region 40 of the first air cooling circuit 5 is higher than a second protection class of the second air cooling circuit 6, in particular in the installation position of the charging station 1 in the case of attachment to a wall 50, as shown in FIG. 1.

In detail, the number of first power electronics components 3 has at least one inductive component. In the exemplary embodiment of FIGS. 1 to 9 these are two transformers 3a and in the exemplary embodiment of FIGS. 10 to 14 this is one transformer 3a, and in the shown exemplary embodiments these are an EMC choke 3b and three grid chokes 3c, as shown in FIGS. 4 to 6 and 10 and 12. In alternative exemplary embodiments, the number of first power electronics components may, in addition or as an alternative, have at least one audio transformer or pulse transformer.

Figure 9:
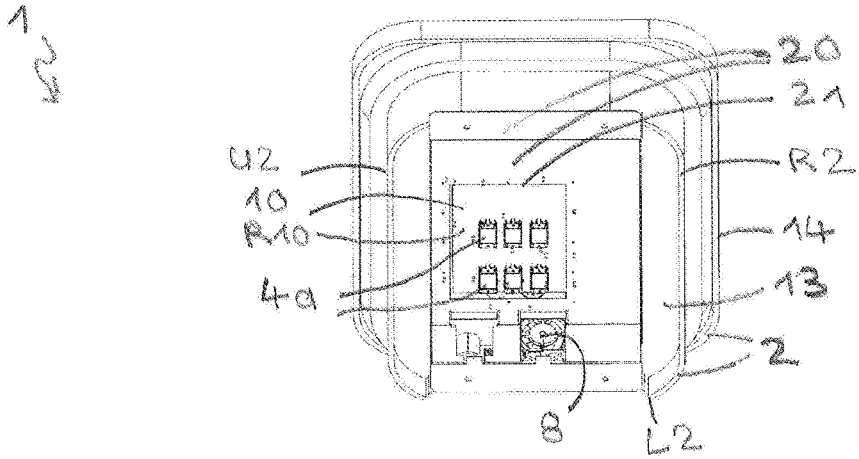
FIG. 9 shows a further schematic perspective view of the charging station of FIG. 1 without a heat sink.

The number of second power electronics components 4 furthermore has at least one power electronics switch. In the shown exemplary embodiments, these are six IGBTs 4a, as shown in FIG. 9. In alternative exemplary embodiments, the number of second power electronics components may have two, three, four, five and/or more than six power electronics switches, in particular IGBTs.

Figure 4:
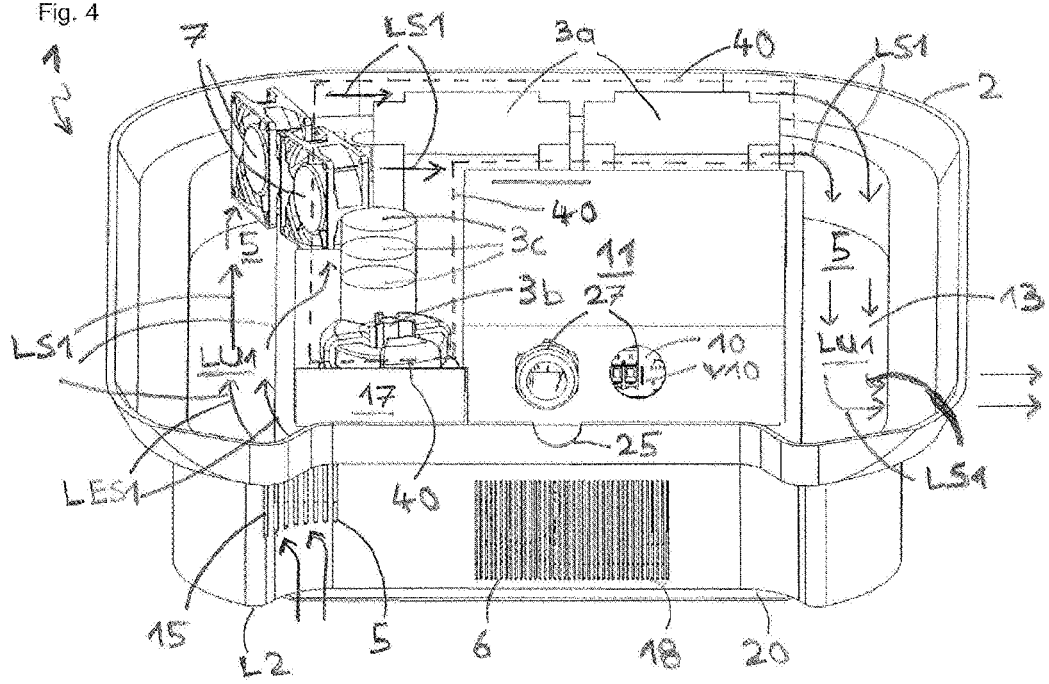
FIG. 4 shows a further schematic perspective view of the charging station of FIG. 1 without a housing cover.
Figure 8:
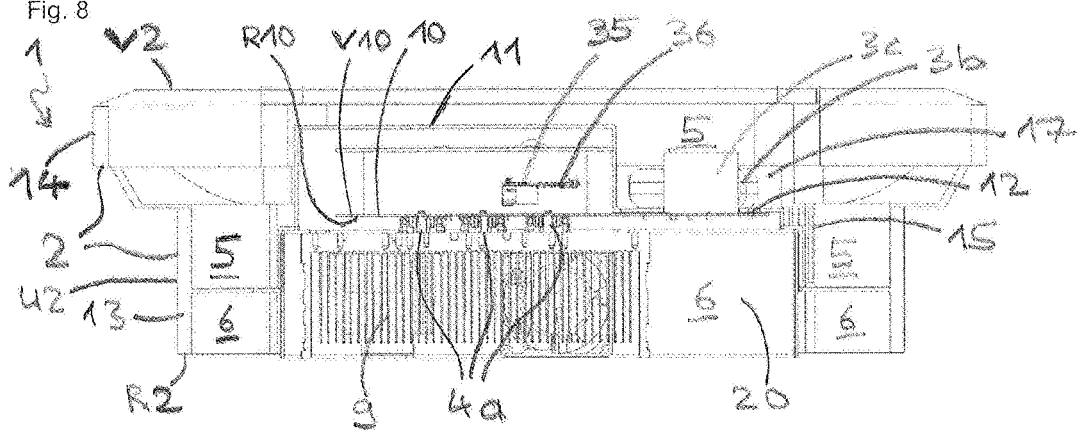
FIG. 8 shows a schematic cross-sectional view of the charging station of FIG. 1.
Figure 10:
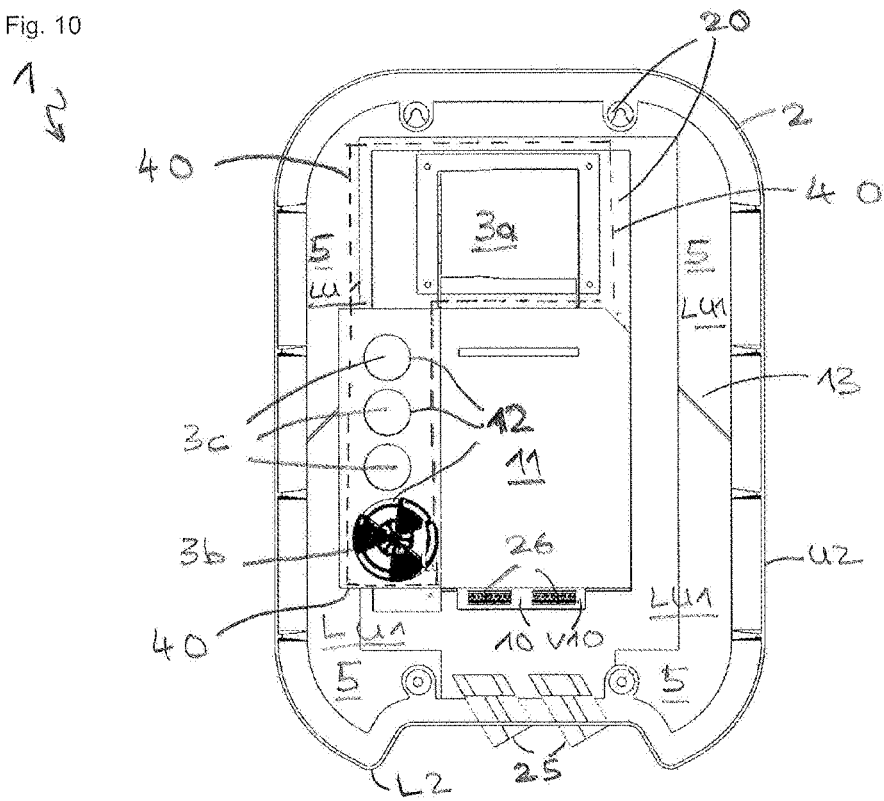
FIG. 10 shows a schematic perspective view of a further charging station according to the invention without a housing cover.

The number of first power electronics components 3 is arranged spatially at least partly in the first air cooling circuit 5, in particular in the at least one region 40, in contact with air LU1 of the first air cooling circuit 5, as shown in FIGS. 4, 8 and 10.

Figure 3:
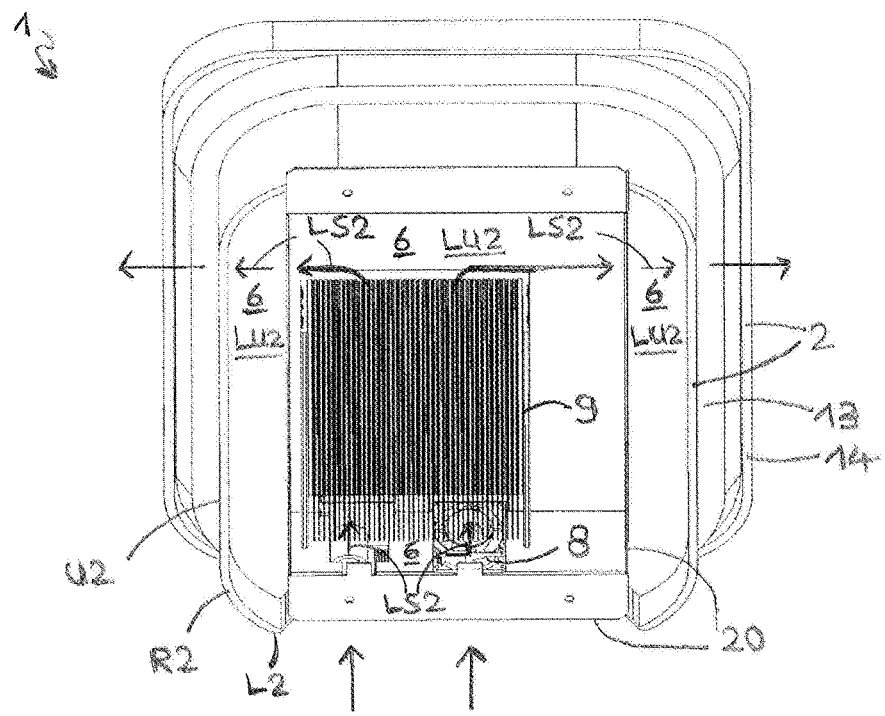
FIG. 3 shows a further schematic perspective view of a housing rear side and a housing top side of the charging station of FIG. 1.
Figure 7:
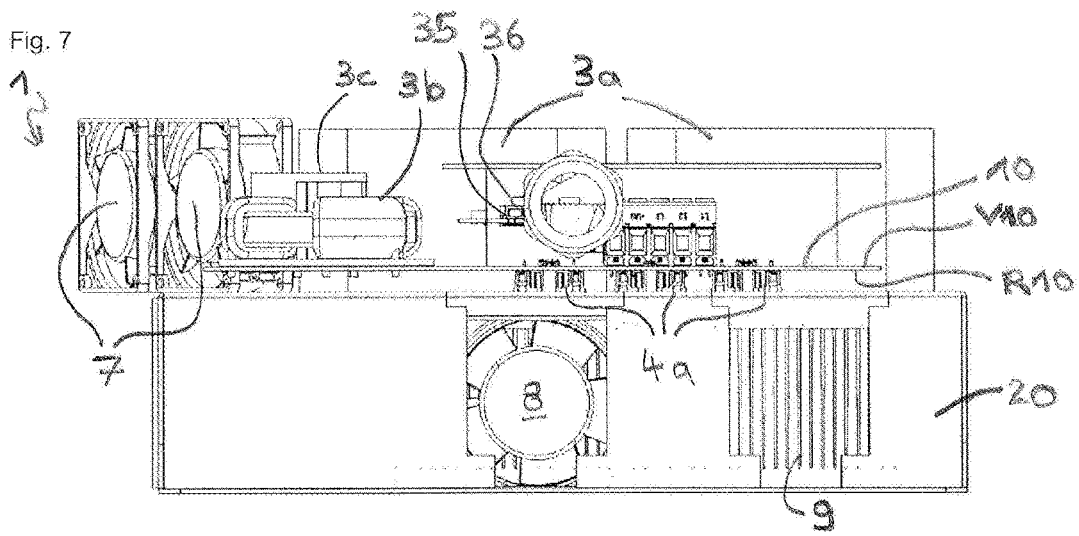
FIG. 7 shows a further schematic perspective view of the charging station of FIG. 1 without a housing cover, a housing body and a circuit board cover element.

The charging station furthermore has a heat sink 9. The heat sink 9 is arranged spatially at least partly in the second air cooling circuit 6 in contact with air LU2 of the second air cooling circuit 6, as shown in FIGS. 3 and 8. The number of second power electronics components 4 is in contact with the heat sink 9, as shown in FIGS. 7 and 8.

In detail, the number of second power electronics components 4 is not arranged spatially in the second air cooling circuit 6 in contact with air LU2 of the second air cooling circuit 6.

The charging station 1 furthermore has a circuit board 10, in particular arranged spatially in the housing 2, as shown in FIGS. 6 to 9 and 10 to 14. At least one of the number of first power electronics components 3 is, in particular the EMC choke 3b and the grid chokes 3c are, electrically connected to the circuit board 10 and arranged spatially on a circuit board front side V10 of the circuit board 10. In addition, the number of second power electronics components 4 is electrically connected to the circuit board 10 and arranged spatially on a circuit board rear side R10, facing away from the circuit board front side V10, of the circuit board 10.

In detail, the charging station 1 has a circuit board cover element 11, as shown in FIGS. 4, 5, 8 and 10 to 14. The circuit board cover element 11 is arranged spatially in particular in the housing 2, in particular in the first air cooling circuit 5, in particular in contact with air LU1 of the first air cooling circuit 5, and at least partly, in particular completely, covers the circuit board 10 on the front side and has at least one through-aperture 12, four through-apertures 12 in the exemplary embodiment that is shown. The at least one of the number of first power electronics components 3 is guided through the through-aperture 12, in particular the EMC choke 3b and the grid chokes 3c are guided through the through-apertures 12. The heat sink 9 furthermore at least partly, in particular completely, covers the circuit board 10 on the rear side. The number of second power electronics components 4 is arranged spatially between the circuit board 10 and the heat sink 9, in particular covered by the circuit board 10 and/or the heat sink.

The housing 2 furthermore has a housing front side V2 that is vertical in particular in the installation position and a housing rear side R2 facing away from the housing front side V2 and that is vertical in particular in the installation position, as shown in FIGS. 1 to 3, 8 and 9. The charging station 1 is designed such that the housing rear side R2 faces the wall 50, in particular bears against the wall, upon attachment of the charging station 1, as shown in FIG. 1.

The first air cooling circuit 5 is arranged spatially closer to the housing front side V2 than the second air cooling circuit 6.

In detail, the housing 2 has a housing body 13 and a housing cover 14. The first air cooling circuit 5 is arranged spatially at least partly, in particular completely, between the housing body 13 and the housing cover 14, as shown in FIG. 8.

In particular, the housing cover 14 defines the housing front side V2, and the housing body 13 defines the housing rear side R2.

The housing body 13 furthermore has at least one cable through-aperture 25 for a charging cable and/or a grid cable. In the exemplary embodiment of FIGS. 1 to 9 this is one cable through-aperture 25, and in the exemplary embodiment of FIGS. 10 to 14 these are two cable through-apertures 25. The cable through-aperture/apertures 25 leads/lead into the first air cooling circuit 5, in particular from the outside.

In detail, the cable through-aperture/apertures 25 is/are arranged spatially on a housing bottom side L2, which is horizontal in particular in the installation position, of the housing 2, in particular of the housing body 13 in the installation position of the charging station 1, in particular in the case of attachment to the wall 50.

The circuit board 10 additionally has at least one electrical terminal 26, in particular two, for the charging cable and/or the grid cable, as shown in FIGS. 6, 7 and 10 to 14.

Figure 5:
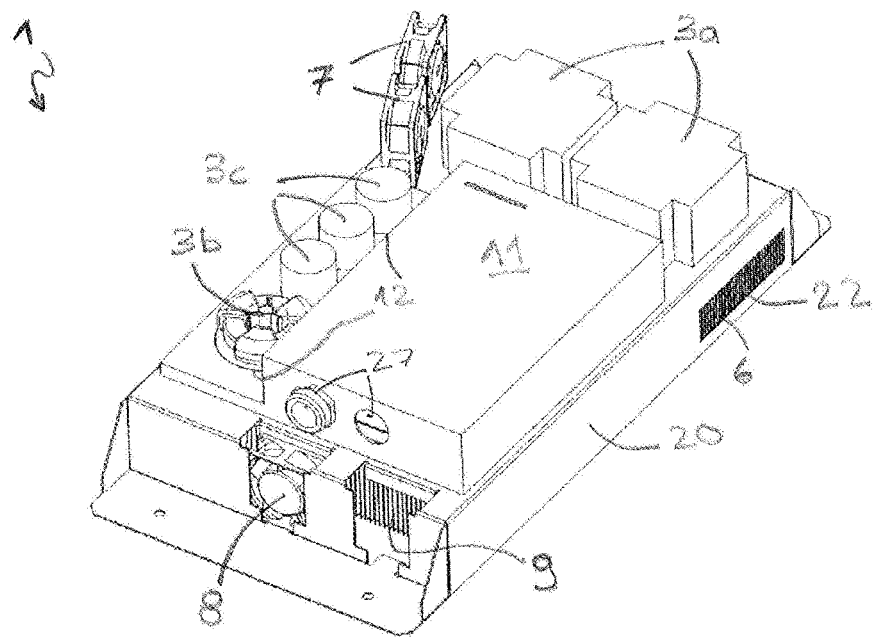
FIG. 5 shows a further schematic perspective view of the charging station of FIG. 1 without a housing cover and a housing body.

In detail, in the exemplary embodiment of FIGS. 1 to 9, the circuit board cover element 11 has at least one further cable through-aperture 27, in particular two, for the charging cable and/or the grid cable, as shown in FIGS. 4 and 5.

The housing 2, in particular the housing body 13, is furthermore open on the housing rear side R2, as shown in FIGS. 3, 8 and 9. The second air cooling circuit 6 is arranged spatially at least partly, in particular completely, on the housing rear side R2.

Figure 2:
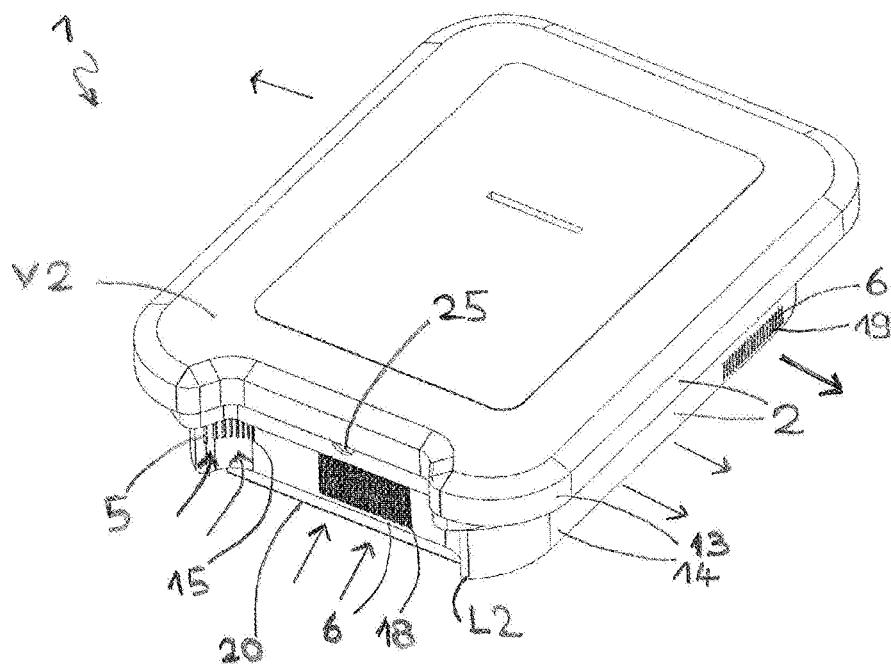
FIG. 2 shows a further schematic perspective view of a housing front side, a housing bottom side and a housing circumferential side of the charging station of FIG. 1.

The first air cooling circuit 5 furthermore has at least one first air inlet aperture 15, in particular several, in the housing 2, in particular in the housing body 13, in particular for air from the outside into the first air cooling circuit 5, as shown in FIGS. 2, 4 and 8.

The first air cooling circuit 5 is designed to guide air of an air inflow LES1 from the first air inlet aperture 15 underneath the number of first power electronics components 3 in the installation position of the charging station 1.

In detail, the first air inlet aperture 15 is arranged spatially underneath the number of first power electronics components 3 in the installation position of the charging station 1, in particular on the housing bottom side L2 of the housing 2, in particular of the housing body 13.

In addition, the charging station 1, in particular the housing 2, in particular the housing body 13, has a component shielding element 17, as shown in FIGS. 4 and 8. The component shielding element 17 and the circuit board cover element 11 shield the number of first power electronics components 3 from an air inflow from the first air inlet aperture 15 directly in the direction of the number of first power electronics components 3 or from being able to be seen directly from the outside. Worded differently: the component shielding element 17 and the circuit board cover element 11 are arranged spatially between the first air inlet aperture 15 and the number of first power electronics components 3. This additionally makes it possible to protect the number of first power electronics components 3 against residual water, where present, in air, in particular in the air inflow LES1, of the first air cooling circuit 5.

Figure 11:
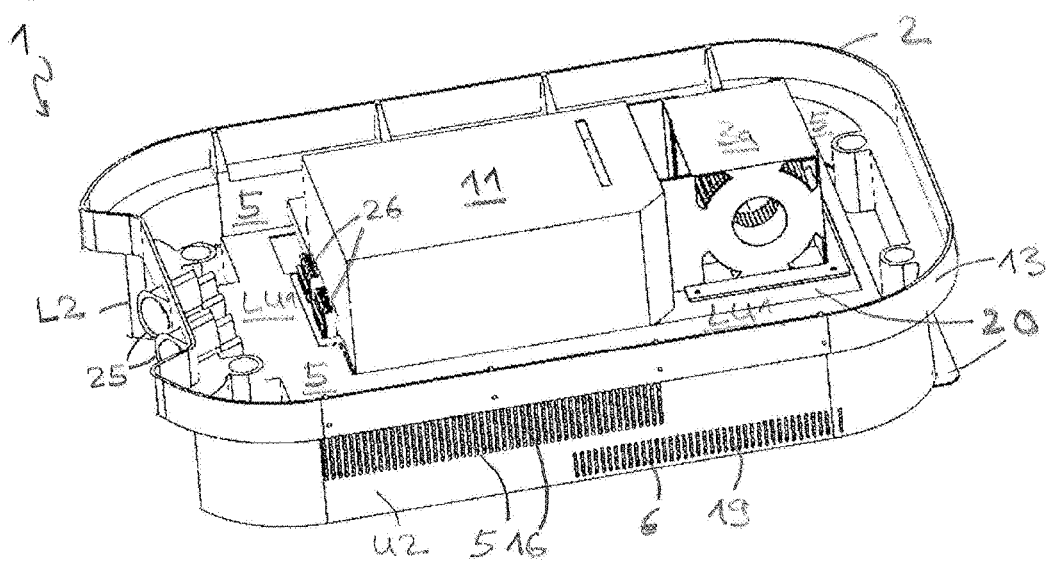
FIG. 11 shows a further schematic perspective view of the charging station of FIG. 10 without a housing cover.
Figure 12:
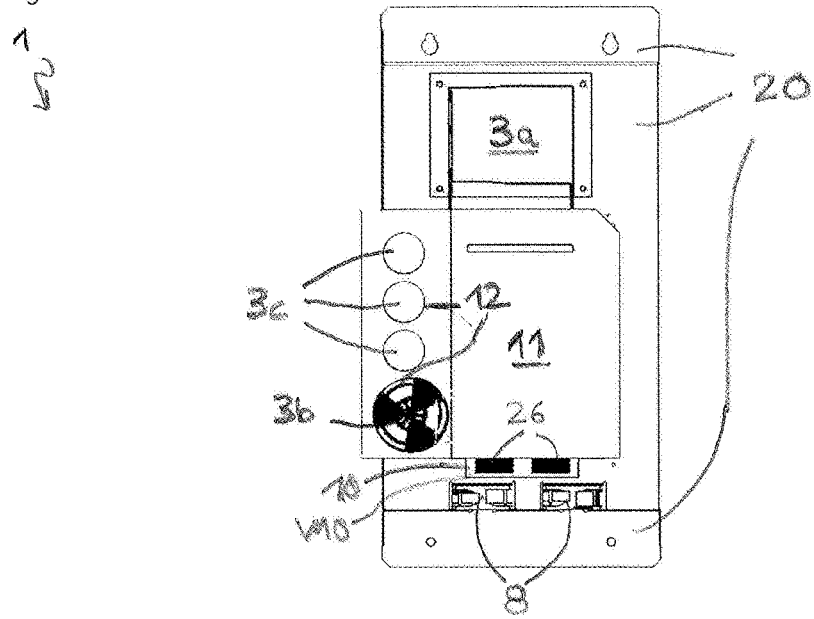
FIG. 12 shows a further schematic perspective view of the charging station of FIG. 10 without a housing cover and a housing body.

The first air cooling circuit 5 furthermore has at least one first air outlet aperture 16, in particular several, in the housing 2, in particular in the housing body 13, in particular for air from the first air cooling circuit 5 to the outside, as shown in FIG. 11. The first air outlet aperture 16 is arranged spatially underneath at least one of the number of first power electronics components 3, in particular the at least one transformer 3a, in the installation position of the charging station 1, in particular on a housing circumferential side U2, which is vertical in particular in the installation position, of the housing 2, in particular of the housing body 13.

The circuit board cover element 11 additionally shields at least one of the number of first power electronics components 3, in particular the EMC choke 3b and the grid chokes 3c, from an air flow from the first air outlet aperture 16 directly in the direction of the at least one of the number of first power electronics components 3, in particular the EMC choke 3b and the grid chokes 3c, or from being able to be seen directly from the outside, as shown in FIG. 11. In other words: the circuit board cover element 11 is arranged spatially between the first air outlet aperture 16 and the at least one of the number of first power electronics components 3, in particular the EMC choke 3b and the grid chokes 3c. This additionally makes it possible to protect the at least one of the number of first power electronics components 3, in particular the EMC choke 3b and the grid chokes 3c, against residual water, where present, in air of the first air cooling circuit 5.

The second air cooling circuit 6 additionally has at least one second air inlet aperture 18, in particular several, in the housing 2, in particular in the housing body 13, in particular for air from the outside into the second air cooling circuit 6, as shown in FIGS. 2 and 4. The second air inlet aperture 18 is arranged spatially on the housing bottom side L2 of the housing 2, in particular of the housing body 13, in the installation position of the charging station 1.

The second air cooling circuit 6 furthermore has at least one second air outlet aperture 19, in particular several, in the housing 2, in particular in the housing body 13, in particular for air from the second air cooling circuit 6 to the outside, as shown in FIGS. 2 and 11. The second air outlet aperture 19 is arranged spatially on the housing circumferential side U2 of the housing 2, in particular of the housing body 13, in the installation position of the charging station, in particular above the heat sink 9.

The first air cooling circuit 5 furthermore has at least one first fan 7, in particular two, as shown in FIGS. 4 to 7. The at least one first fan 7 is designed to convey an air flow LS1 through the first air cooling circuit 5.

During operation, air LU1/LS1 flows from the outside through the first air inlet aperture 15 on the housing bottom side L2 on the left upward into the housing 2 or the first air cooling circuit 5, from the first air inlet aperture 15 upward along the number of first power electronics components 3, to the right, from the top downward to the first air outlet aperture 16 on the housing circumferential side U2 on the right and out of the housing 2 or the first air cooling circuit 5 through the first air outlet aperture 16 to the outside to the right, as shown in FIG. 4.

The second air cooling circuit 6 furthermore has at least one second fan 8, in particular two, as shown in FIGS. 5 to 8 and 12 to 14. The at least one second fan 8 is designed to convey an air flow LS2 through the second air cooling circuit 6.

In detail, the at least one second fan 7 is arranged spatially in the second air cooling circuit 6 such that it blows directly onto the heat sink 9, in particular cooling fins of the heat sink 9.

During operation, air LU2/LS2 flows from the outside through the second air inlet aperture 18 on the housing bottom side L2 centrally upward into the housing 2 or the second air cooling circuit 6, from the second air inlet aperture 18 upward along the heat sink 9, in particular cooling fins of the heat sink 9, to the right and to the left to the at least one second air outlet aperture 19 on the housing circumferential side U2 on the right and on the left and out of the housing 2 or the second air cooling circuit 6 through the at least one second air outlet aperture 19 to the outside to the right and to the left, as shown in FIG. 3.

In addition, the charging station has an in particular cuboid base body 20, as shown in FIGS. 3, 5 to 9 and 12 to 14. The base body 20 carries the number of first power electronics components 3, the number of second power electronics components 4, the first fan 7, the second fan 8, the heat sink 9, the circuit board 10 and the circuit board cover element 11. The housing 2, in particular the housing body 13, is placed on the base body 20.

In detail, the base body 20 has a recess or a cutout 21 for the number of second power electronics components 4 and/or the heat sink 9, in particular for the number of second power electronics components 4 to make contact with the heat sink 9, as shown in FIG. 9.

Figure 6:
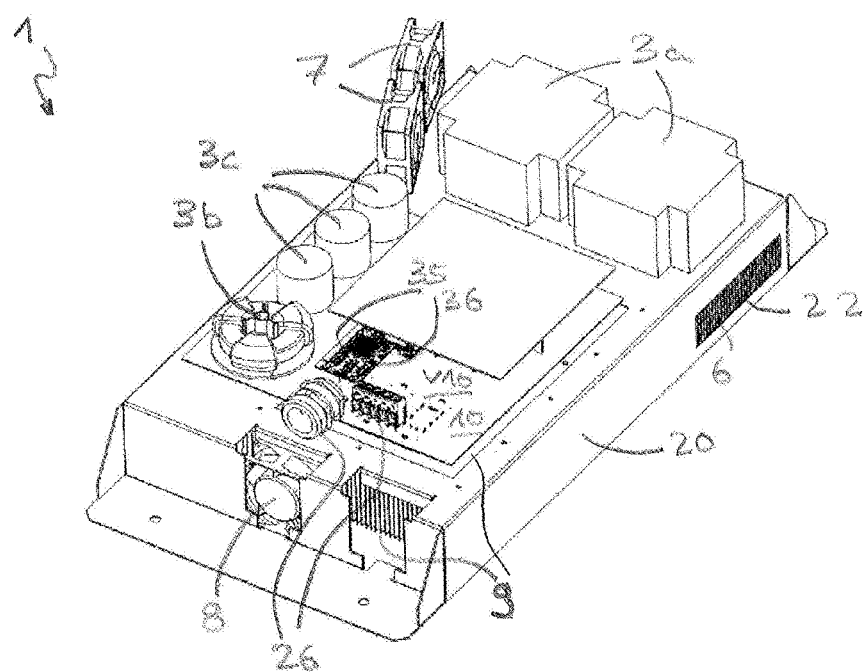
FIG. 6 shows a further schematic perspective view of the charging station of FIG. 1 without a housing cover, a housing body and a circuit board cover element.
Figure 13:
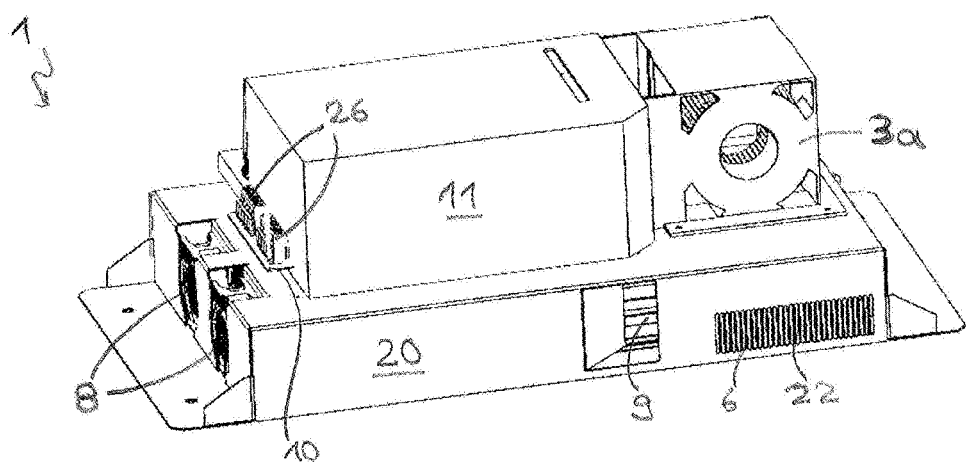
FIG. 13 shows a further schematic perspective view of the charging station of FIG. 10 without a housing cover and a housing body.
Figure 14:
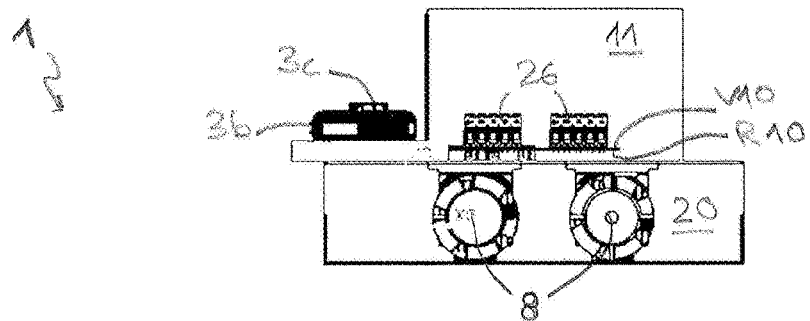
FIG. 14 shows a further schematic perspective view of the charging station of FIG. 10 without a housing cover and a housing body.

The second air cooling circuit 6 is furthermore arranged spatially partly in the base body 20. In particular, the second air cooling circuit 6 has at least one air through-aperture 22 in the base body 20, in particular inside a base body wall of the base body 20, in particular for the air flow LS2, as shown in FIGS. 5, 6 and 13. In detail, the at least one air through-aperture 22 is opposite the at least one second air outlet aperture 19. The base body 20 is furthermore open on the housing rear side R2.

The first air cooling circuit 5 and the second air cooling circuit 6 are furthermore separated from one another by the housing 2, in particular the housing body 13, the heat sink 9, the base body 20 and at least one gasket.

In detail, a spatial arrangement from the housing rear side R2 in the direction x of the housing front side V2 is as follows, as shown in FIG. 8: the housing rear side R2, the second air cooling circuit 6 and the heat sink 9, the number of second power electronics components 4, the circuit board 10, the number of first power electronics components 3 and the circuit board cover element 11, the first air cooling circuit 5 and the housing front side V2. The circuit board 10, in particular a plane of the circuit board 10, is in particular arranged parallel to the housing front side V2 and/or the housing rear side R2.

This spatial arrangement allows a flat structure of the charging station 1. Worded differently: the charging station 1 barely protrudes from the wall 50 in the installation position of the charging station 1 upon attachment to the wall 50.

In detail, the dimensions of the charging station 1 are as follows, as shown in FIG. 1:

Length L in a range from a minimum of 660 millimeters (mm) to a maximum of 860 mm, in particular 760 mm.

Width B in a range from a minimum of 460 mm to a maximum of 660 mm, in particular 560 mm.

Height H in a range from a minimum of 150 mm, in particular from a minimum of 185 mm, to a maximum of 250 mm, in particular to a maximum of 225 mm.

A ratio of length L to width B may in particular be defined by $L/B=B/(L-B)$, and in particular thus as a golden ratio, or a shape of the charging station 1 may be referred to as a golden rectangle.

The charging station 1 additionally has a control device 35, in particular a processor, in particular an FPGA, on a control circuit board 36, as shown in FIGS. 6 to 8. The control device 35 is designed or configured so as to control the charging of the electric vehicle, in particular so as to control the number of first power electronics components 3, the number of second power electronics components 4, the first fan 7 and the second fan 8.

The charging station 1 additionally has at least one communication and/or interface device, in particular an RJ45 connector, a field bus interface, an SD card reader and/or a WLAN module, on the control circuit board 36.

In detail, the control circuit board 36 is arranged spatially between the circuit board 10 and the circuit board cover element 11. This makes it possible to protect the control circuit board 36 against residual water, where present, in air of the first air cooling circuit 5.

The charging station 1 furthermore has at least one further electrical component, in particular an electrolytic capacitor. In detail, the at least one further electrical component is electrically connected to the circuit board 10 and arranged spatially on the circuit board front side V10 of the circuit board 10. In particular, the at least one further electrical component is arranged spatially between the circuit board 10 and the circuit board cover element 11. This makes it possible to protect the at least one further electrical component against residual water, where present, in air of the first air cooling circuit 5.

Apart from the first air inlet aperture 15 and the first air outlet aperture 16, the housing 2 is closed, in particular the housing body 13 and the housing cover 14, or the first air cooling circuit 5, are closed. The housing 2, in particular the housing body 13, in particular has no air apertures on a housing top side, which is horizontal or horizontally aligned in particular in the installation position, of the housing 2, in particular of the housing body 13. The number of first power electronics components 3, and in particular also the number of second power electronics components 4, are arranged spatially inside the housing 2 or the first air cooling circuit 5. The charging station 1 or a structure of the charging station 1 is designed or configured such that, in spite of the air apertures 15, 16, and in particular also 18, 19, IP54 sealtightness is achieved in the housing 2, in particular IP54 sealtightness of the first air cooling circuit 5, in particular of the at least one region 40.

As is clear from the exemplary embodiments that are shown and explained above, the invention provides an advantageous charging station for charging an electric vehicle, which allows protection and optimum cooling of power electronics components, on the one hand, and inexpensive manufacture, on the other hand.

What is claimed is:

1. A charging station for charging an electric vehicle, the charging station comprising:
a housing;
a number of first power electronics components and a number of second power electronics components the second power electronics components being different from the first power electronics components, wherein the first power electronics components and the second power electronics components are arranged spatially in the housing; and
a first air cooling circuit and a second air cooling circuit separate from the first air cooling circuit, wherein
the first air cooling circuit and the second air cooling circuit are arranged spatially in the housing,
the first air cooling circuit serves to cool the number of first power electronics components,
the second air cooling circuit serves to cool the number of second power electronics components, and
the charging station is designed in such a way that a first protection class of at least one region of the first air cooling circuit is higher than a second protection class of the second air cooling circuit.

2. The charging station according to claim 1, wherein at least one of:
the number of first power electronics components has at least one inductive component, and
the number of second power electronics components has at least one power electronics switch.

3. The charging station according to claim 2, wherein the at least one inductive component comprises one or more of a transformer, an audio transformer, a pulse transformer, and a choke.

4. The charging station according to claim 3, wherein the choke is an electromagnetic compatibility (EMC) choke, a grid choke, or a power factor compensation (PFC) choke.

5. The charging station according to claim 2, wherein the at least one power electronics switch is a power semiconductor.

6. The charging station according to claim 1, wherein at least one of:
the first air cooling circuit has at least one first fan, wherein the at least one first fan is designed to convey an air flow through the first air cooling circuit, and
the second air cooling circuit has at least one second fan, wherein the at least one second fan is designed to convey an air flow through the second air cooling circuit.

7. The charging station according to claim 6, further comprising:
a base body,
wherein the base body carries one or more of:
the number of first power electronics components,
the number of second power electronics components,
the at least one first fan,
the at least one second fan,
a heat sink,
a circuit board, and
a circuit board cover element, and
wherein the housing is placed on the base body.

8. The charging station according to claim 7, wherein the first air cooling circuit and the second air cooling circuit are separated at least partly from one another by the housing, the heat sink, a housing body, the base body, and/or at least one gasket.

9. The charging station according to claim 1, wherein at least one of:
at least one first power electronic component of the number of first power electronics components is arranged spatially at least partly in the first air cooling circuit in contact with air of the first air cooling circuit, and
the charging station has a heat sink, wherein the heat sink is arranged spatially at least partly in the second air cooling circuit in contact with air of the second air cooling circuit, and at least one second power electronics component of the number of second power electronics components is in contact with the heat sink.

10. The charging station according to claim 1, further comprising:
a circuit board, wherein
at least one first power electronics component of the number of first power electronics components is electrically connected to the circuit board and is arranged spatially on a circuit board front side of the circuit board, and
at least one second power electronics component of the number of second power electronics components is electrically connected to the circuit board and arranged spatially on a circuit board rear side, facing away from the circuit board front side, of the circuit board.

11. The charging station according to claim 10, wherein at least one of:
the charging station has a circuit board cover element, wherein the circuit board cover element at least partly covers the circuit board on the front side and has at least one through-aperture, wherein the at least one first power electronics component of the number of first power electronics components is guided through the through-aperture, and
a heat sink at least partly covers the circuit board on the circuit board rear side and the at least one second power electronics component of the number of second power electronics components is arranged spatially between the circuit board and the heat sink.

12. The charging station according to claim 1, wherein
the housing has a housing front side and a housing rear side facing away from the housing front side,
the charging station is designed in such a way that the housing rear side, when the charging station is attached to a wall, faces the wall, and
the first air cooling circuit is arranged spatially closer to the housing front side than the second air cooling circuit.

13. The charging station according to claim 1, wherein the housing comprises:
a housing body and a housing cover, wherein the first air cooling circuit is arranged spatially at least partly between the housing body and the housing cover.

14. The charging station according to claim 13, wherein
the housing body has at least one cable through-aperture for a charging cable and/or a grid cable, wherein the cable through-aperture leads into the first air cooling circuit.

15. The charging station according to claim 1, wherein
the housing has a housing front side and a housing rear side facing away from the housing front side,
the charging station is designed in such a way that the housing rear side, when the charging station is attached to a wall, faces the wall,
the housing is open on the housing rear side, and
the second air cooling circuit is arranged spatially at least partly on the housing rear side.

16. The charging station according to claim 1, wherein
the first air cooling circuit has at least one first air inlet aperture in the housing, and
the first air cooling circuit is designed to guide air of an air inflow from the first air inlet aperture underneath at least one first power electronics component of the number of first power electronics components in an installation position of the charging station.

17. The charging station according to claim 1, wherein
the first air cooling circuit has at least one first air inlet aperture and/or at least one first air outlet aperture in the housing, and
the at least one first air inlet aperture and/or the at least one first air outlet aperture are arranged spatially underneath at least one first power electronics component of the number of first power electronics components in an installation position of the charging station.

18. The charging station according to claim 17, wherein
the at least one first air inlet aperture and/or the at least one first air outlet aperture are arranged spatially on a housing bottom side and/or a housing circumferential side of the housing.

19. The charging station according to claim 1, wherein at least one of:
the second air cooling circuit has at least one second air inlet aperture in the housing, the at least one second air inlet aperture being arranged spatially on a housing bottom side of the housing in an installation position of the charging station, and
the second air cooling circuit has at least one second air outlet aperture in the housing, the at least one second air outlet aperture being arranged spatially on a housing circumferential side of the housing in the installation position of the charging station.

* * * * *